US006798636B2

(12) United States Patent
D'Alpaos et al.

(10) Patent No.: US 6,798,636 B2
(45) Date of Patent: Sep. 28, 2004

(54) METHOD OF ESTIMATING THE EFFECT OF THE PARASITIC CURRENTS IN AN ELECTROMAGNETIC ACTUATOR FOR THE CONTROL OF AN ENGINE VALVE

(75) Inventors: Egidio D'Alpaos, Pieve D'Alpago (IT); Flavia D'Antonio, Bologna (IT)

(73) Assignee: Magneti Marelli Powertrain S.p.A., Turin (IT)

( * ) Notice: Subject to any disclaimer, the term of this patent is extended or adjusted under 35 U.S.C. 154(b) by 293 days.

(21) Appl. No.: 10/007,860

(22) Filed: Nov. 13, 2001

(65) Prior Publication Data

US 2002/0117132 A1 Aug. 29, 2002

(30) Foreign Application Priority Data

Nov. 14, 2000 (IT) .................................... BO2000A0660

(51) Int. Cl.⁷ .......................... H01H 51/12; H01H 51/14
(52) U.S. Cl. ....................................... 361/160; 361/144
(58) Field of Search ................................ 361/160, 144, 361/143, 152, 153

(56) References Cited

U.S. PATENT DOCUMENTS

| | | | | |
|---|---|---|---|---|
| 4,659,969 | A | | 4/1987 | Stupak, Jr. .................. 318/128 |
| 4,715,331 | A | | 12/1987 | Kreuter et al. ........... 123/90.11 |
| 5,698,910 | A | * | 12/1997 | Bryant et al. ................. 310/12 |
| 6,208,497 | B1 | * | 3/2001 | Seale et al. .................. 361/160 |
| 6,249,418 | B1 | * | 6/2001 | Bergstrom .................. 361/152 |
| 6,499,447 | B2 | * | 12/2002 | Cosfeld et al. .......... 123/90.11 |
| 6,549,390 | B1 | * | 4/2003 | Ozawa et al. ............... 361/139 |
| 6,571,823 | B2 | * | 6/2003 | Rossi et al. .................. 137/554 |

OTHER PUBLICATIONS

David Johnson et al., Basic Electric Circuit Analysis, 1990, Prentice–Hall, pp. 590–600.*

Hanson, MCS 471 Numerical Analysis, Computational Linear Algebra, Practice Problems, pp. 1–2 and 1–4. Web page print.*

Vekara, T.T., et al.; "Dynamic Model of an Electromagnetic Massive Core Brake Actuator"; *IEEE Transactions on Magnetics*, vol. 32, No. 3, May 1, 1996, pp. 1970–1974; XP 000657908.

Murty, B.V.; "A New Approach for the Analysis of Dynamic Behavior of Solenoid Actuators with Time Dependent Voltage Input"; *Conference Record of the 1990 IEEE Industry Applications Society Annual Meeting*, Oct. 7–12, 1990; pp. 318–324; XP–002177901.

Brauer, J.R., et al.; "Alternative Dynamic Electromechanical Models of Magnetic Actuators Containing Eddy Currents"; *IEEE Transactions on Magnetics*, vol. 36, No. 4, Jul. 2000; pp. 1333–1336; XP002177902.

Piron, M., et al.; "Rapid Computer–Aided Design Method for Fast–Acting Solenoid Actuators"; *IEEE Transactions on Industry Applications*, vol. 35, No. 5, Sep. 1999; pp. 991–999; XP000924251.

\* cited by examiner

Primary Examiner—Gregory J. Toatley, Jr.
Assistant Examiner—Zeev Kitov
(74) Attorney, Agent, or Firm—Howrey Simon Arnold & White LLP

(57) ABSTRACT

A method of estimating the effect of the parasitic currents in an electromagnetic actuator for the control of an engine valve, the parasitic currents being modelled by means of an equivalent parasitic current which circulates in an equivalent turn which is short-circuited and magnetically coupled to a magnetic circuit formed by an electromagnet and an actuator body and the value of the equivalent parasitic current being estimated by resolving the differential equation obtained by applying the generalized Ohm's law to the equivalent turn.

13 Claims, 2 Drawing Sheets

METHOD OF ESTIMATING THE EFFECT OF THE PARASITIC CURRENTS IN AN ELECTROMAGNETIC ACTUATOR FOR THE CONTROL OF AN ENGINE VALVE

This application claims priority under 35 USC §119 of application number BO 2000A 000660, filed on Nov. 14, 2000 in Italy.

The present invention relates to a method of estimating the effect of the parasitic currents in an electromagnetic actuator for the control of an engine valve.

BACKGROUND OF THE INVENTION

As is known, internal combustion engines of the type disclosed in Italian Patent Application BO99A000443 filed on Aug. 4, 1999 are currently being tested, in which the movement of the intake and exhaust valves is performed by electromagnetic actuators. These electromagnetic actuators have undoubted advantages since they make it possible to control each valve according to a law optimised with respect to any operating condition of the engine, whereas conventional mechanical actuators (typically camshafts) make it necessary to define a lift profile of the valves which is an acceptable compromise for all the possible operating conditions of the engine.

An electromagnetic actuator for a valve of an internal combustion engine of the type described above normally comprises at least one electromagnet adapted to displace an actuator body of ferromagnetic material mechanically connected to the stem of the respective valve. In order to apply a particular law of motion to the valve, a control unit drives the electromagnet with a current that varies over time in order appropriately to displace the actuator body.

It has been observed from experimental tests that in order to obtain a relatively high precision in the control of the valve it is necessary to control the position of the actuator body in feedback; it is therefore necessary to have a precise reading, substantially in real time, of the position of this actuator body.

In electromagnetic actuators of the type described above, the position of the actuator body is read by means of a laser sensor which is, however, costly, delicate and difficult to calibrate, and therefore unsuited to mass production. Methods have therefore been proposed for the estimation of the position of the actuator body based on the measurement of the electrical magnitudes (voltage and current) of the electrical circuits coupled to the actuating electromagnet.

These methods for estimating the position of the actuator body are not, however, very precise, as they are subject to the effect of the parasitic currents that are induced in the actuator body as a result of the rapid displacements of this actuator body.

In order to limit the effect of the parasitic currents induced in the actuator body, it has been proposed to make the actuator body from ferromagnetic, but not electrically conducting material, or it has been proposed to make the actuator body from laminated ferromagnetic material. It has been observed, however, that both when using a ferromagnetic but not electrically conducting material and when using a laminated ferromagnetic material, the effect of the parasitic currents induced in the actuator body is attenuated but not eliminated. Moreover, the use of a ferromagnetic but not electrically conducting material or a laminated ferromagnetic material reduces the mechanical strength of the actuator body.

SUMMARY OF THE INVENTION

The object of the present invention is to provide a method of estimating the effect of the parasitic currents in an electromagnetic actuator for the control of an engine valve that is free from the drawbacks described above and that is in particular simple and economic to embody.

The present invention therefore relates to a method of estimating the parasitic currents in an electromagnetic actuator for the control of an engine valve as claimed in claim 1.

BRIEF DESCRIPTION OF THE DRAWINGS

The present invention will be described below with reference to the accompanying drawings, which show a non-limiting embodiment thereof, in which.

DETAILED DESCRIPTION OF THE INVENTION

Figure 1:
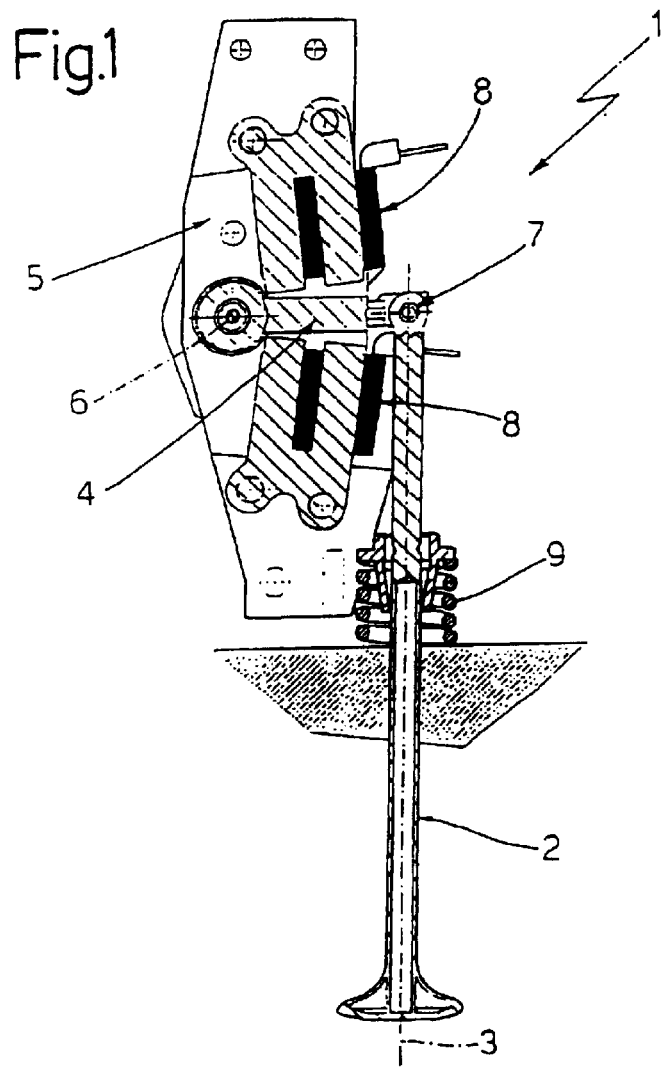
FIG. 1 is a diagrammatic view, in lateral elevation and partly in section, of an engine valve and of a relative electromagnetic actuator operating in accordance with the method of the present invention.

In FIG. 1, an electromagnetic actuator (of the type disclosed in Italian Patent Application BO99A000443 filed on 4 Aug. 1999) is shown overall by 1 and is coupled to an intake or exhaust valve 2 of an internal combustion engine of known type in order to displace this valve 2 along a longitudinal axis 3 of the valve between a closed position (known and not shown) and a position of maximum opening (known and not shown).

The electromagnetic actuator 1 comprises an oscillating arm 4 at least partly of ferromagnetic material which has a first end hinged on a support 5 so that it can oscillate about an axis 6 of rotation perpendicular to the longitudinal axis 3 of the valve 2, and a second end connected by means of a hinge 7 to an upper end of the valve 2. The electromagnetic actuator 1 further comprises two electromagnets 8 borne in a fixed position by the support 5 so that they are disposed on opposite sides of the oscillating arm 4, and a spring 9 coupled to the valve 2 and adapted to maintain the oscillating arm 4 in an intermediate position (shown in FIG. 1) in which the oscillating arm 4 is equidistant from the polar expansions 10 of the two electromagnets 8.

In operation, the electromagnets 8 are controlled by a control unit 11 (shown in FIG. 2) so as alternatively or simultaneously to exert a force of attraction of magnetic origin on the oscillating arm 4 in order to cause it to rotate about the axis 6 of rotation, thereby displacing the valve 2 along the respective longitudinal axis 3 and between the above-mentioned closed and maximum open positions (not shown). The valve 2 is in particular in the above-mentioned closed position (not shown) when the oscillating arm 4 is in abutment on the lower electromagnet 8, is in the above-mentioned position of maximum opening (not shown) when the oscillating arm 4 is in abutment on the upper electromagnet 8, and is in a partially open position when neither of the electromagnets 8 are being supplied and the oscillating arm 4 is in the above-mentioned intermediate position (shown in FIG. 1) as a result of the force exerted by the spring 9.

Figure 2:
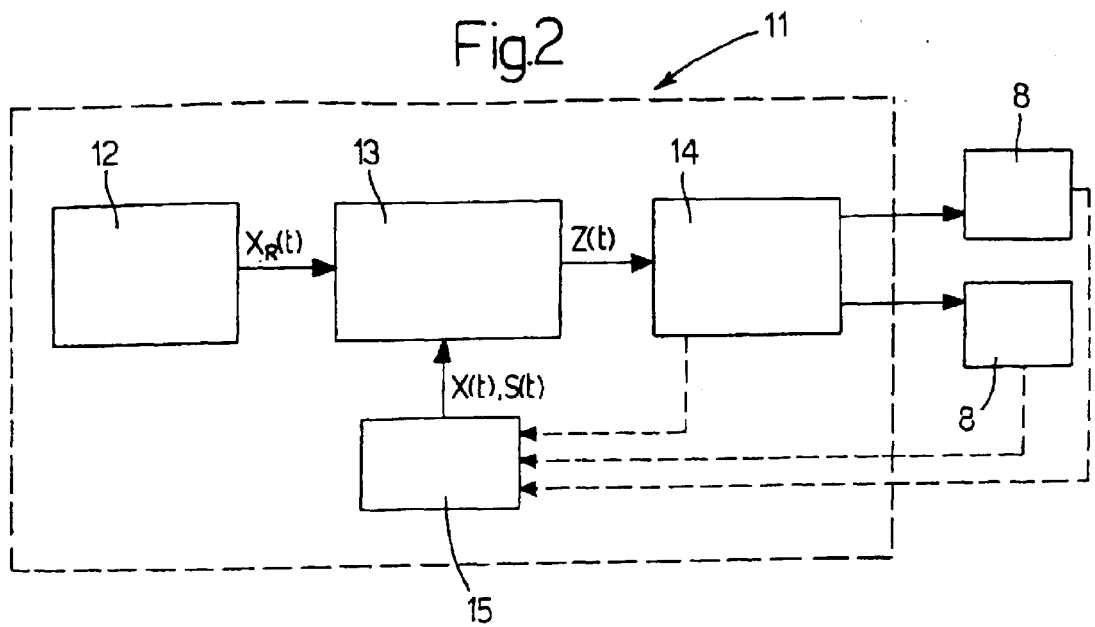
FIG. 2 is a diagrammatic view of a control unit of the actuator of FIG. 1.
Figure 3:
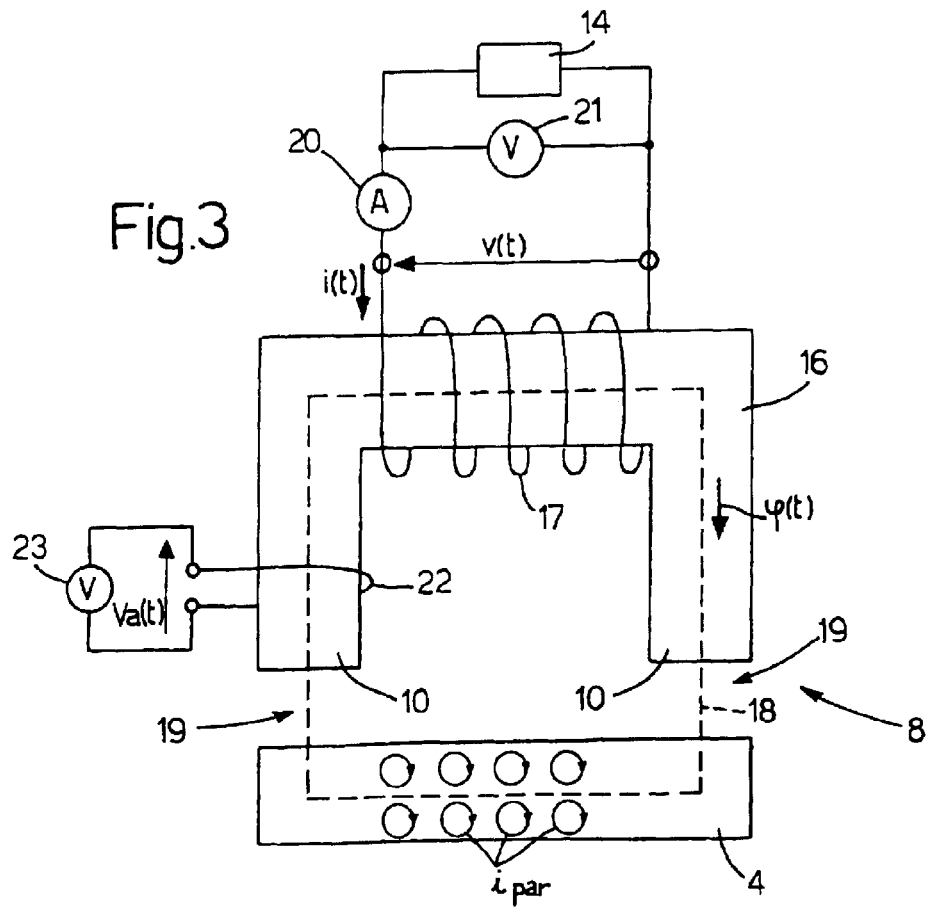
FIG. 3 is a diagrammatic view of an electromagnetic circuit of the control unit of FIG. 2.

The control unit 11 controls the position of the oscillating arm 4, i.e. the position of the valve 2, in feedback and in a substantially known manner, as a function of the operating conditions of the engine. In particular, as shown in FIG. 2, the control unit 11 comprises a reference generation block 12, a calculation block 13, a drive block 14 adapted to supply the electromagnets 8 with a current variable over time and an estimation block 15 which is adapted to estimate, substantially in real time, the position x(t) and the speed s(t) of the oscillating arm 4 by means of measurements of electrical magnitudes of the drive block 14 and/or of the two electromagnets 8. As shown in FIG. 3, each electromagnet 8 comprises a respective magnetic core 16 coupled to a corresponding coil 17 which is supplied by the drive block 14 as a function of commands received from the calculation block 13.

In operation, the reference generation block 12 receives as input a plurality of parameters indicating the operating conditions of the engine (for instance the load, the number of revolutions, the position of the butterfly body, the angular position of the drive shaft, the temperature of the cooling fluid) and supplies the calculation block 13 with an objective value $x_R(t)$ (i.e. a desired value) of the position of the oscillating arm 4 (and therefore of the valve 2).

The calculation block 13, on the basis of the objective value $x_R(t)$ of the position of the oscillating arm 4 and on the basis of the estimated value x(t) of the position of the oscillating arm 4 received from the estimation block 15, processes and supplies a control signal z(t) for driving the electromagnets 8 to the drive block 14. According to a preferred embodiment, the calculation block 13 also processes the control signal z(t) on the basis of an estimated value s(t) of the speed of the oscillating arm 4 received from the estimation block 15.

According to a further embodiment (not shown), the reference generation block 12 supplies the calculation block 13 with both an objective value $x_R(t)$ of the position of the oscillating arm 4 and an objective value $s_R(t)$ of the speed of the oscillating arm 4.

The oscillating arm 4 is disposed between the polar expansions 10 of the two electromagnets 8, which are borne by the support 5 in a fixed position and at a fixed distance with respect to one another, and therefore the estimated value x(t) of the position of the oscillating arm 4 can be directly obtained by means of a simple algebraic summing operation from an estimated value d(t) of the distance existing between a predetermined point of the oscillating arm 4 and a corresponding point of one of the two electromagnets 8. Similarly, the estimated value s(t) of the speed of the oscillating arm 4 can be directly obtained from an estimated value of the speed existing between a predetermined point of the oscillating arm 4 and a corresponding point of the one of the two electromagnets 8.

In order to calculate the value x(t), the estimation block 15 calculates two estimated values $d_1(t)$, $d_2(t)$ of the distance existing between a predetermined point of the oscillating arm 4 and a corresponding point of each of the two electromagnets 8; from the two estimated values $d_1(t)$, $d_2(t)$, the estimation block 15 obtains two values $x_1(t)$, $x_2(t)$ generally different from one another as a result of noise and measurement errors. According to a preferred embodiment, the estimation block 15 calculates a mean of the two values $x_1(t)$, $x_2(t)$, possibly weighted on the basis of the accuracy attributed to each value x(t). Similarly, in order to calculate the value s(t), the estimation block 15 calculates the two estimated values of the speed existing between a predetermined point of the oscillating arm 4 and a corresponding point of each of the two electromagnets 8; from the two estimated values of the speed, the estimation block 15 obtains two values $s_1(t)$, $s_2(t)$ generally different from one another as a result of noise and measurement errors. According to a preferred embodiment, the estimation block 15 calculates a mean of the two values $s_1(t)$, $s_2(t)$, possibly weighted on the basis of the accuracy attributed to each value s(t).

The methods used by the estimation block 15 to calculate an estimated value d(t) of the distance existing between a predetermined point of the oscillating arm 4 and a corresponding point of the electromagnet 8 and to calculate an estimated value of the speed existing between a predetermined point of the oscillating arm 4 and a corresponding point of the electromagnet 8 are described below with particular reference to FIG. 3, in which a single electromagnet 8 is shown.

In operation, when the drive block 14 applies a voltage v(t) variable over time to the terminals of the coil 17 of the electromagnet 8, this coil 17 is traversed by a current i(t) thereby generating a flux φ(t) via a magnetic circuit 18 coupled to the coil 17.

The magnetic circuit 18 coupled to the coil 17 is in particular composed of the core 16 of ferromagnetic material of the electromagnet 8, the oscillating arm 4 of ferromagnetic material and the air gap 19 existing between the core 16 and the oscillating arm 4.

The magnetic circuit 18 has an overall reluctance R defined by the sum of the reluctance $R_{fe}$ of iron and the reluctance $R_0$ of the air gap; the value of the flux φ(t) circulating in the magnetic circuit 18 is linked to the value of the current i(t) circulating in the coil 17 by the following relationship (in which N is the number of turns of the coil 17):

$$N*i(t)=R*\phi(t)$$

$$R=R_{fe}+R_0$$

In general, the value of the overall reluctance R depends both on the position x(t) of the oscillating arm 4 (i.e. on the amplitude of the air gap 19, which is equal, less a constant, to the position x(t) of the oscillating arm 4) and on the value assumed by the flux φ(t). Less negligible errors (i.e. as a first approximation), it can be assumed that the reluctance value of iron $R_{fe}$ depends solely on the value assumed by the flux φ(t), while the reluctance value of the air gap $R_0$ depends solely on the position x(t), i.e.:

$$R(x(t), \phi(t))=R_{fe}(\phi(t))+R_0(x(t))$$

$$N*i(t)=R(x(t), \phi(t))*\phi(t)$$

$$N*i(t)=R_{fe}(\phi(t))*\phi(t)+R_0(x(t))*\phi(t)$$

By resolving the last equation given above with respect to $R_0(x(t))$, it is possible to obtain the air gap reluctance value $R_0$ when the value of the current i(t) (which value can be readily measured by an ammeter 20) is known, when the value of N (fixed and dependent on the constructional characteristics of the coil 17) is known, when the value of the flux φ(t) is known and when the relationship existing between the reluctance of iron $R_{fe}$ and the flux φ (known from the constructional characteristics of the magnetic circuit 18 and the magnetic properties of the material used, i.e. readily obtainable from experimental tests) is known.

The relationship existing between the air gap reluctance $R_0$ and the position x can be obtained in a relatively simple manner by analysing the characteristics of the magnetic circuit 18 (an example of a model of behaviour of the air gap 19 is represented by the following equation). Once the relationship between the air gap reluctance $R_0$ and the position x is known, the position x can be obtained from the air gap reluctance $R_0$ by applying the inverse relationship (that can be applied either by using the exact equation or by applying an approximated digital calculation method). The above can be summarised in the following relationships (in which $H_{fe}((\phi(t))=R_{fe}(\phi(t))*\phi(t)$:

$$R_o(x(t)) = \frac{N \cdot i(t) - H_{fe}(\varphi(t))}{\varphi(t)}$$

$$R_o(x(t)) = K_1[1 - e^{-k_2 \cdot x(t)} + k_3 \cdot x(t)] + K_0$$

$$x(t) = R_0^{-1}(R_o(x(t))) = R_0^{-1}\left(\frac{N \cdot i(t) - H_{fe}(\varphi(t))}{\varphi(t)}\right)$$

The constants $K_0$, $K_1$, $K_2$, $K_3$ are constants that can be obtained experimentally by a series of measurements of the magnetic circuit 18.

It will be appreciated from the above that if it is possible to measure the flux $\phi(t)$ it is possible to calculate the position x(t) of the oscillating arm 4 in a relatively simple manner. Moreover, starting from the value of the position x(t) of the oscillating arm 4, it is possible to calculate the value of the speed s(t) of this oscillating arm 4 by a simple operation of derivation over time of the position x(t).

According to a first embodiment, the flux $\phi(t)$ can be calculated by measuring the current i(t) circulating through the coil 17 by means of the ammeter 20 of known type, by measuring the voltage v(t) applied to the terminals of the coil 17 by means of a voltmeter 21 of known type and by knowing the value of the resistance RES of the coil 17 (which value can be readily measured). This method of measurement of the flux $\phi(t)$ is based on the following relationships (in which N is the number of turns of the coil $$\frac{d\varphi(t)}{dt} = \frac{1}{N} \cdot (v(t) - RES \cdot i(t))$$

$$\varphi(T) = \frac{1}{N} \cdot \int_0^T (v(t) - RES \cdot i(t))dt + \varphi(0)$$

17):

The conventional instant 0 is selected such that the value of the flux $\phi(0)$ at this instant 0 is precisely known; in particular, the instant 0 is normally selected within a time interval during which current does not pass through the coil 17 and, therefore, the flux $\phi$ is substantially zero (the effect of any residual magnetisation is negligible), or the instant 0 is chosen at a predetermined position of the oscillating arm 4 (typically when the oscillating arm 4 is in abutment on the polar expansions 10 of the electromagnet 8), at which the value of the position x, and therefore the value of the flux $\phi$, is known.

The method described above for the calculation of the flux $\phi(t)$ is fairly precise and rapid (i.e. free from delays); however, this method raises some problems due to the fact that the voltage v(t) applied to the terminals of the coil 17 is normally generated by a switching amplifier integrated in the drive block 14 and therefore varies continuously between three values ($+V_{supply}$, 0, $-V_{supply}$), two of which ($+V_{supply}$, e $-V_{supply}$) have a relatively high value and are therefore difficult to measure precisely without the assistance of relatively complex and costly measurement circuits. Moreover, the method described above for the calculation of the flux $\phi(t)$ requires continuous reading of the current i(t) circulating through the coil 17 and a continuous knowledge of the value of the resistance RES of the coil 17 which resistance value, as is known, varies with variations in the temperature of the coil 17.

According to a further embodiment, the magnetic core 16 is coupled to an auxiliary coil 22 (composed of at least one turn and generally provided with a number $N_a$ of turns) to whose terminals a further voltmeter 23 is connected; as the terminals of the coil 22 are substantially open (the internal resistance of the voltmeter 23 is so high that it can be considered infinite without thereby introducing appreciable errors), no current passes through the coil 22 and the voltage $v_a(t)$ at its terminals depends solely on the derivative of the flux $\phi(t)$ over time, from which it is possible to obtain the flux by means of an integration operation (reference should be made to the considerations discussed above as regards the value $\phi(0)$):

$$\frac{d\varphi(t)}{dt} = \frac{1}{N_a} \cdot v_a(t)$$

$$\varphi(T) = \frac{1}{N_a} \cdot \int_0^T v_a(t)dt + \varphi(0)$$

The use of the reading of the voltage $v_a(t)$ of the auxiliary coil 22 makes it possible to avoid any type of measurements and/or estimates of electrical current and electrical resistance to calculate the flow $\phi(t)$; moreover, the value of the voltage $v_a(t)$ is linked to the value of the value of the voltage v(t) (less dispersions) by the relationship:

$$v_a(t) = \frac{N_a}{N} \cdot (v(t) - RES \cdot i(t))$$

as a result of which, by appropriately dimensioning the number of turns $N_a$ of the auxiliary coil 22, it is possible relatively simply to keep the value of the voltage $v_a(t)$ within a measurable interval in a precise manner.

It will be appreciated from the above that, by using the reading of the voltage $v_a(t)$ of the auxiliary coil 22, the calculation of the value of the flux $\phi(t)$ is more precise, more rapid and simpler with respect to the use of the reading of the voltage v(t) at the terminals of the coil 17.

In the above description, two methods of estimating the derivative of the flux $\phi(t)$ over time have been given. According to an embodiment, it is chosen to use only one method for the calculation of the derivative of the flux $\phi(t)$. According to a further embodiment, it is chosen to use both methods for the calculation of the derivative of the flux $\phi(t)$ over time and to use a mean (possibly weighted with respect to the estimated precision) of the results of the two methods applied or to use one result to verify the other (if there is a substantial discrepancy between the two results, it is probable that an error has occurred in the estimates).

It will lastly be appreciated that the above-described methods for estimating the position x(t) can be used only when current is passing through the coil 17 of an electromagnet 8. For this reason, as described above, the estimation block 15 works with both the electromagnets 8 in order to use the estimate performed with one electromagnet 8 when the other is de-activated. When both the electromagnets 8 are active, the estimation block 15 calculates a mean of the two values x(t) calculated with the two electromagnets 8, possibly weighted as a function of the precision attributed to each value x(t) (generally the estimation of the position x carried out with respect to an electromagnet 8 is more precise when the oscillating arm 4 is relatively close to the polar expansions 10 of this electromagnet 8).

It has been observed that as a result of the rapid displacements of the oscillating arm 4 affected by the magnetic field generated by an electromagnet 8, parasitic currents $i_{par}$ which are substantially of pulse type and are relatively high are induced in this oscillating arm 4. In particular, these parasitic currents $i_{par}$ are responsible, together with the current i(t) circulating in the coil 17, for the generation of the flux φ(t) passing through the magnetic circuit 18 by supplying a contribution $h_p(t)$ of ampere-turns to the generation of this flux φ(t):

$$R(x(t), \phi(t)) = R_{fe}(\phi(t)) + R_o(x(t))$$

$$N^* i(t) + h_p(t) = R(x(t), \phi(t)) * \phi(t)$$

$$N^* i(t) + h_p(t) = R_{fe}(\phi(t)) * \phi(t) + R_o(x(t)) * \phi(t)$$

$$N^* i(t) + h_p(t) = H_{fe}(\phi(t)) + R_o(x(t)) * \phi(t)$$

$$R_o(x(t)) = \frac{N \cdot i(t) + h_p(t) - H_{fe}(\varphi(t))}{\varphi(t)}$$

$$x(t) = R_0^{-1}(R_o(x(t))) = R_0^{-1}\left(\frac{N \cdot i(t) + h_p(t) - H_{fe}(\varphi(t))}{\varphi(t)}\right)$$

It will be appreciated that if, in the estimation of the position x(t) of the oscillating arm 4, no account is taken of the effect of the parasitic currents $i_{par}$, the estimation of the position x(t) will be incorrect by a value that is the higher the more intense the parasitic currents $i_{par}$.

Figure 4:
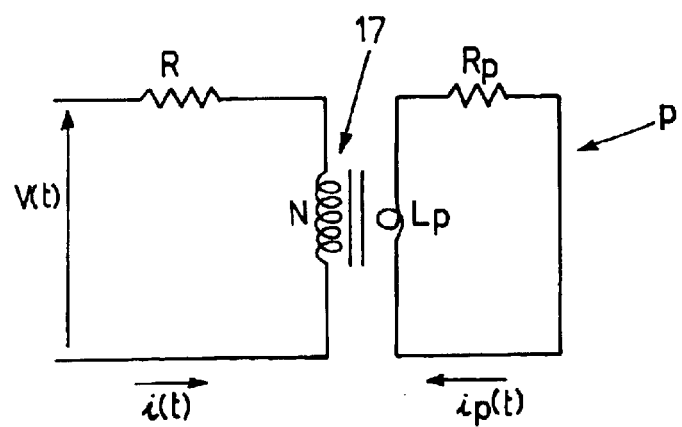
FIG. 4 is a diagrammatic view of an electrical circuit modelling the behaviour of parasitic currents induced in the electromagnetic actuator of FIG. 1.

In order to try to estimate the contribution $h_p(t)$ of ampere-turns of the parasitic currents $i_{par}$, it is possible to model these parasitic currents $i_{par}$ with a single equivalent parasitic current $i_p(t)$ which circulates in a single equivalent turn p (shown in FIG. 4) magnetically coupled to the magnetic circuit 18 in which the magnetic flux φ(t) is circulating; the turn p has its own resistance $R_p$, its own inductance $L_p$ and is closed in short-circuit. The values of the resistance $R_p$ and the inductance $L_p$ of the turn p may be obtained in a relatively simple manner by means of a series of experimental measurements of the electromagnet 8. Obviously, the turn p is also magnetically coupled to the power coil 17 of the electromagnet 8, which coil 17 has N turns and its own resistance RES.

The equations which describe the electrical circuit of the coil 17 and the turn p are given by the application of the generalised Ohm's law:

$$v(t) - RES \cdot i(t) = N \cdot \frac{d\varphi(t)}{dt} - R_p \cdot i_p(t) = \frac{d\varphi(t)}{dt} + L_p \cdot \frac{di_p(t)}{dt}$$

Moving onto the L-transforms (Laplace transforms) and obtaining the transfer function of the current $i_p$ in the plane of the Laplace transforms provides:

$$-R_p \cdot I_p = s \cdot \Phi + L_p \cdot s \cdot \Phi$$

$$I_p = -\frac{s}{L_p \cdot s + R_p} \cdot \Phi$$

Once the values of the resistance $R_p$ and the inductance $L_p$ of the turn p are known and once the value of the magnetic flux φ(t) has been estimated by one of the two methods described above, the value of the equivalent parasitic current $i_p(t)$ can be obtained by applying a known method of L-antitransformation; preferably, the value of the equivalent parasitic current $i_p(t)$ is obtained by making the above-mentioned equation discrete and applying a digital method (that can be readily implemented via software).

It will be appreciated that the equivalent parasitic current $i_p(t)$ is applied to the magnetic circuit 18 by circulating in a single equivalent turn p, and therefore the equivalent parasitic current $i_p(t)$ produces a contribution $h_p(t)$ of ampere-turns equal to its intensity. In other words:

$$h_p(t) = i_p(t) \cdot 1$$

$$R_o(x(t)) = \frac{N \cdot i(t) + i_p(t) - H_{fe}(\varphi(t))}{\varphi(t)}$$

$$x(t) = R_0^{-1}(R_o(x(t))) = R_0^{-1}\left(\frac{N \cdot i(t) + i_p(t) - H_{fe}(\varphi(t))}{\varphi(t)}\right)$$

What is claimed is:

1. A method of estimating the effect of the parasitic currents ($i_{par}$) in an electromagnetic actuator (1) for the control of an engine valve (2), the actuator body (4) being made at least partially from ferromagnetic material and being displaced towards at least one electromagnet (8) under the action of the force of magnetic attraction generated by this electromagnet (8), the method being characterised in that the parasitic currents ($i_{par}$) are modelled by means of an equivalent parasitic current ($i_p$) which circulates in an equivalent turn (p) which is short-circuited and magnetically coupled to a magnetic circuit (18) formed by the electromagnet (8) and the actuator body (4) and in that the value of the equivalent parasitic current ($i_p$) is estimated by resolving the differential equation obtained by applying the generalised Ohm's law to the equivalent turn (p) and further characterised in that a position (x) of the actuator body (4) with respect to the electromagnet (8) is determined as a function of the value assumed by the overall reluctance (R) of a magnetic circuit (18) comprising the electromagnet (8) and the actuator body (4), the value of the overall reluctance (R) of the magnetic circuit (18) being calculated as a ratio between an overall value of ampere-turns associated with the magnetic circuit (18) and a value of the magnetic flux (φ) passing through the magnetic circuit (18), the overall value of ampere-turns being calculated as the sum of a first contribution due to the value of a current (i) circulating through a coil (17) of the electromagnet (8) and a second contribution ($h_p$) due to the equivalent parasitic current ($i_p$).

2. A method as claimed in claim 1, in which the generalised Ohm's law is applied to the equivalent turn (p) by means of the equation:

$$-R_p \cdot i_p(t) = \frac{d\varphi(t)}{dt} + L_p \cdot \frac{di_p(t)}{dt}$$

in which:

φ is the magnetic flux passing through the magnetic circuit (18);

$i_p$ is the equivalent parasitic current ($i_p$);

$R_p$ is the resistance ($R_p$) of the equivalent turn (p);

$L_p$ is the inductance ($L_p$) of the equivalent turn (p).

3. A method as claimed in claim 2, characterised in that the differential equation is transformed in the Laplace domain and resolved with respect to the equivalent parasitic current ($i_p$).

4. A method as claimed in claim 3, characterised in that in order to obtain the estimate of the equivalent parasitic current ($i_p$), the differential equation in the Laplace domain is made discrete and resolved by digital methods.

5. A method as claimed in claim 2, characterised in that the value of the magnetic flux (φ) is estimated by measuring the value assumed by some electrical magnitudes (i, v; $v_a$)

of an electrical circuit (17; 22) coupled to the magnetic circuit (18), calculating the derivative over time of the magnetic flux (φ) as a linear combination of the values of the electrical magnitudes (i, v; $v_a$) and integrating the derivative of the magnetic flux (φ) over time.

6. A method as claimed in claim 5, characterised in that the current (i) circulating through a coil (17) of the electromagnet (8) and the voltage (v) applied to the terminals of this coil (17) are measured, the derivative over time of the magnetic flux (φ) and the magnetic flux itself (φ) being calculated by applying the following formulae:

$$\frac{d\varphi(t)}{dt} = \frac{1}{N} \cdot (v(t) - RES \cdot i(t))$$

$$\varphi(T) = \frac{1}{N} \cdot \int_0^T (v(t) - RES \cdot i(t))dt + \varphi(0)$$

in which:
φ is the magnetic flux (φ);
N is the number of turns of the coil (17);
v is the voltage (v) applied to the terminals of the coil (17);
RES is the resistance of the coil (17);
i is the current (i) circulating through the coil (17).

7. A method as claimed in claim 5, characterised in that the voltage ($V_a$) present at the terminals of an auxiliary coil (22) coupled to the magnetic circuit (18) and linking with the magnetic flux (φ) is measured, the auxiliary coil (22) being in substance electrically open and the derivative over time of the magnetic flux (φ) and the magnetic flux itself (φ) being calculated by applying the following formulae:

$$\frac{d\varphi(t)}{dt} = \frac{1}{Na} \cdot v_{aus}(t)$$

$$\varphi(T) = \frac{1}{Na} \cdot \int_0^T v_{aus}(t)dt + \varphi(0)$$

in which:
φ is the magnetic flux (φ);
Na is the number of turns of the auxiliary coil (22);
$V_a$ is the voltage ($v_a$) present at the terminals of the auxiliary coil (22).

8. A method as claimed in claim 1, characterised in that it is assumed that the overall reluctance (R) is formed by the sum of a first reluctance ($R_0$) due to an air gap (19) of the magnetic circuit (18) and a second reluctance ($R_{fe}$) due to the component of ferromagnetic material (16, 4) of the magnetic circuit (18), the first reluctance ($R_0$) depending on the constructional characteristics of the magnetic circuit (18) and on the value of the position (x) and the second reluctance ($R_{fe}$) depending on the constructional characteristics of the magnetic circuit (18) and on a value of a magnetic flux (φ) passing through the magnetic circuit (18), the position (x) being determined as a function of the value assumed by the first reluctance ($R_0$).

9. A method as claimed in claim 8, characterised in that the value of the second reluctance ($R_{fe}$) is calculated as a function of the value of the magnetic flux (φ), and the value of the first reluctance ($R_0$) is calculated as the difference between the value of the overall reluctance (R) and the value of the second reluctance ($R_{fe}$).

10. A method as claimed in claim 8, characterised in that a first mathematical relationship that expresses the value of the first reluctance ($R_0$) as a function of the value of the position (x) is defined, the position (x) being determined by estimating a value of the first reluctance ($R_0$) and applying the operation of inversion of the first mathematical relationship to this value of the first reluctance ($R_0$).

11. A method as claimed in claim 10, characterised in that the first mathematical relationship is defined by the equation:

$$R_0(x(t)) = K_1[1 - e^{-k_2 \cdot (t)} + k_3 \cdot x(t)]K_0$$

in which $R_0$ is the first reluctance ($R_0$), x(t) is the position (x), and $K_0$, $K_1$, $K_2$, $K_3$ are four constants.

12. A method of estimating the position (x) of an actuator body (4) in an electromagnetic actuator (1) for the control of an engine valve (2), the actuator body (4) being made at least partly from ferromagnetic material and being displaced towards at least one electromagnet (8) under the action of the force of magnetic attraction generated by this electromagnet (8), the method being characterised in that the position (x) of the actuator body (4) with respect to the electromagnet (8) is determined as a function of the value assumed by the overall reluctance (R) of a magnetic circuit (18) comprising the electromagnet (8) and the actuator body (4), the value of the overall reluctance (R) of the magnetic circuit (18) being calculated as a ratio between an overall value of ampere-turns associated with the magnetic circuit (18) and a value of the magnetic flux (φ) passing through this magnetic circuit (18) and the overall value of ampere-turns being calculated as the sum of a first contribution due to the value of a current (i) circulating through a coil (17) of the electromagnet (8) and a second contribution ($h_p$) due to parasitic currents ($i_{par}$).

13. A method as claimed in claim 12, characterised in that the parasitic currents ($i_{par}$) are modelled by means of an equivalent parasitic current ($i_p$) which circulates in an equivalent turn (p) which is short-circuited and magnetically coupled to a magnetic circuit (18) formed by the electromagnet (8) and the actuator body (4) and the value of the equivalent parasitic current ($i_p$) is estimated by resolving the differential equation obtained by applying the generalised Ohm's law to the equivalent turn (p).

* * * * *

UNITED STATES PATENT AND TRADEMARK OFFICE
CERTIFICATE OF CORRECTION

PATENT NO. : 6,798,636 B2
DATED : September 28, 2004
INVENTOR(S) : Egidio D'Alpaos and Flavia D'Antonio It is certified that error appears in the above-identified patent and that said Letters Patent is hereby corrected as shown below:

Column 5,
Lines 10 and 14, replace " $\dfrac{N \cdot i(t) - H_{fe}(\varphi(t))}{\varphi(t)}$ " with -- $\dfrac{N \cdot i(t) - H_{fe}(\phi(t))}{\phi(t)}$ --

Line 36, replace " $\dfrac{d\varphi(t)}{dt}$ " with -- $\dfrac{d\phi(t)}{dt}$ --.

Line 40, replace "$\varphi(T)$" with -- $\phi(T)$ --.
Line 40, replace "$\varphi(0)$" with -- $\phi(0)$ --.

Column 6,
Line 16, replace " $\dfrac{d\varphi(t)}{dt}$ " with -- $\dfrac{d\phi(t)}{dt}$ --.

Line 21, replace "$\varphi(T)$" with -- $\phi(T)$ --.
Line 21, replace "$\varphi(0)$" with -- $\phi(0)$ --.

Column 7,
Lines 18 and 20, replace " $\dfrac{N \cdot i(t) + h_p(t) - H_{fe}(\varphi(t))}{\varphi(t)}$ " with -- $\dfrac{N \cdot i(t) + h_p - H_{fe}(\phi(t))}{\phi(t)}$ --.

Line 46, replace " $\dfrac{d\varphi(t)}{dt}$ " with -- $\dfrac{d\phi(t)}{dt}$ --.

Column 8,
Line 11, replace " $\dfrac{N \cdot i(t) + i_p(t) - H_{fe}(\varphi(t))}{\varphi(t)}$ " with -- $\dfrac{N \cdot i(t) + i_p - H_{fe}(\phi(t))}{\phi(t)}$ --.

Line 47, replace " $\dfrac{d\varphi(t)}{dt}$ " with -- $\dfrac{d\phi(t)}{dt}$ --.

UNITED STATES PATENT AND TRADEMARK OFFICE
CERTIFICATE OF CORRECTION

PATENT NO. : 6,798,636 B2
DATED : September 28, 2004
INVENTOR(S) : Egidio D'Alpaos and Flavia D'Antonio It is certified that error appears in the above-identified patent and that said Letters Patent is hereby corrected as shown below:

<u>Column 9,</u>
Lines 13 and 34, replace " $\frac{d\varphi(t)}{dt}$ " with -- $\frac{d\phi(t)}{dt}$ --.

Lines 15 and 37, replace "$\varphi(T)$" with -- $\phi(T)$ --.
Lines 15 and 37, replace "$\varphi(0)$" with -- $\phi(0)$ --

Signed and Sealed this

Eighteenth Day of January, 2005

JON W. DUDAS
*Director of the United States Patent and Trademark Office*